(12) United States Patent
Bu et al.

(10) Patent No.: US 7,306,995 B2
(45) Date of Patent: Dec. 11, 2007

(54) REDUCED HYDROGEN SIDEWALL SPACER OXIDE

(75) Inventors: Haowen Bu, Plano, TX (US); Clinton L. Montgomery, Coppell, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 10/739,973

(22) Filed: Dec. 17, 2003

(65) Prior Publication Data

US 2005/0133876 A1   Jun. 23, 2005

(51) Int. Cl.
*H01L 21/336* (2006.01)

(52) U.S. Cl. .............. 438/288; 438/184; 438/230; 257/E29.266; 257/E29.279; 257/E29.152; 257/E29.166

(58) Field of Classification Search ........... 438/265, 438/592, 696, 184, 230, 288; 257/637, 640
See application file for complete search history.

(56) References Cited

U.S. PATENT DOCUMENTS

2002/0016084 A1* 2/2002 Todd .................. 438/791
2004/0086640 A1* 5/2004 Luo et al. .............. 427/248.1
2004/0161936 A1* 8/2004 Jin et al. .................. 438/690
2004/0232468 A1* 11/2004 Solayappan ............. 257/310
2005/0014354 A1* 1/2005 Ozawa et al. ............ 438/595
2005/0112817 A1* 5/2005 Cheng et al. ............ 438/219
2005/0151179 A1* 7/2005 Parekh et al. ............ 257/296

FOREIGN PATENT DOCUMENTS

| EP | 506287 | * | 9/1992 |
| JP | 4-184932 | * | 7/1992 |
| JP | 2003-264247 | * | 9/2003 |
| WO | WO 00/03425 | * | 1/2000 |

OTHER PUBLICATIONS

P. Kohli, et al. "Effect of Nitride Sidewall Spacer Process on Boron Dose Loss in Ultra Shallow Junction Formation".

* cited by examiner

*Primary Examiner*—A. Sefer
(74) *Attorney, Agent, or Firm*—Rose Alyssa Keagy; W. James Brady; Frederick J. Telecky, Jr.

(57) ABSTRACT

An embodiment of the invention is a method of making a semiconductor structure 10 where the spacer oxide layer 90 is formed by a hydrogen free precursor CVD process. Another embodiment of the invention is a semiconductor structure 10 having a spacer oxide layer 90 with a hydrogen content of less than 1%.

11 Claims, 4 Drawing Sheets

REDUCED HYDROGEN SIDEWALL SPACER OXIDE

CROSS-REFERENCE TO RELATED APPLICATIONS

This application is related to application Ser. No. 10/316,468 filed on Dec. 10, 2002 and entitled "Improving Source Drain and Extension Dopant Concentration". With its mention in this section, this patent application is not admitted to be prior art with respect to the present invention.

BACKGROUND OF THE INVENTION

This invention relates to the use of sidewall spacer oxides in semiconductor transistors.

DETAILED DESCRIPTION OF THE INVENTION

The present invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Figure 1:
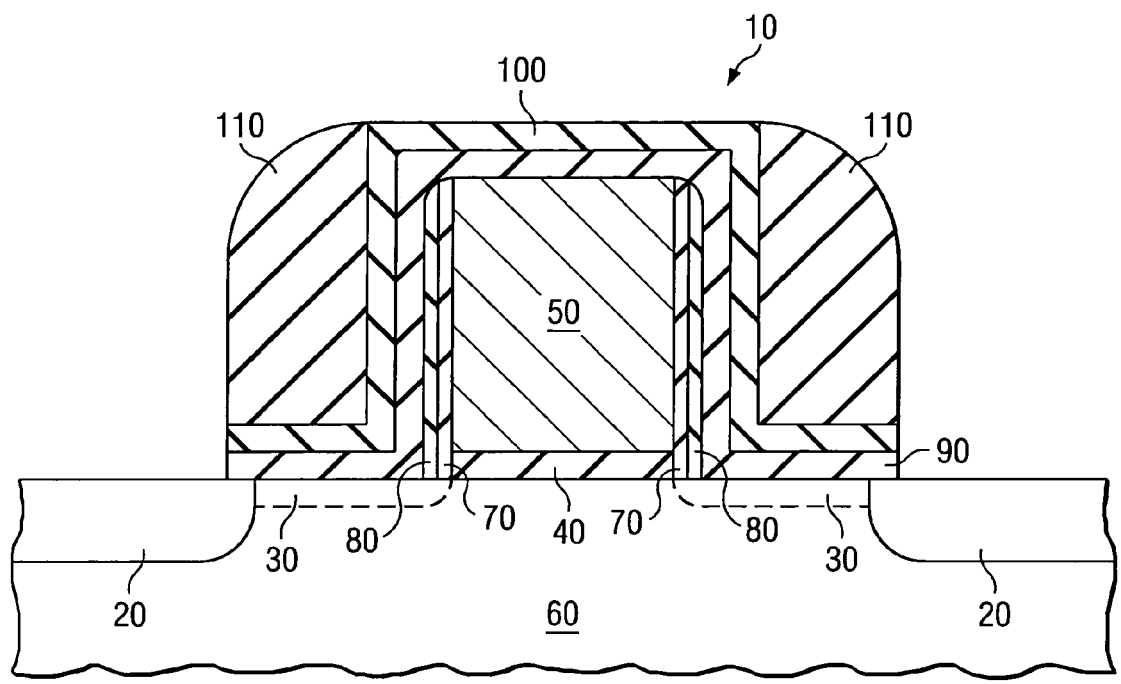
FIG. 1 is a cross-sectional view of a MOS transistor in accordance with a first embodiment of the present invention.

Referring to the drawings, FIG. 1 is a cross-sectional view of a semiconductor structure 10 in accordance with the present invention. In the example application the semiconductor structure 10 is a MOS transistor (i.e. CMOS, NMOS or PMOS). However, it is within the scope of the invention to use a semiconductor structure 10 as a basis for forming any one of a variety of semiconductor devices, such as a bipolar junction transistor or a diode.

In the example shown in FIG. 1, the active portion of the transistor is comprised of source/drain regions 20, source/drain extension regions 30, and a gate that is comprised of a gate oxide 40 and gate electrode 50. The example MOS transistor is a p-channel MOS ("PMOS") transistor; therefore it is formed within a n-well region of the semiconductor substrate 60. In addition, the source and drain regions 20 (as well as the medium doped source and drain extension regions 30) have p-type dopants. The PMOS gate is created from a p-type doped polysilicon 50 and a gate oxide 40.

A sidewall structure comprising layers 70, 80, 90, 100, 110 is used during fabrication to enable the proper placement of the source/drain regions 20 and the source/drain extension regions 30. Sidewall layer 70, shown in FIG. 1, is an intermediate oxide layer that covers the transistor gate. The next sidewall layer 80 is an offset nitride layer. Usually the source/drain extension regions 20 are formed using the gate stack 40, 50 and sidewall layers 70, 80 as a mask.

Sidewall layer 90 is a spacer oxide layer. In the best mode application the spacer oxide layer 90 contains reduced amount of hydrogen. Namely, the hydrogen content in spacer oxide layer 90 is generally less than 1%.

The next sidewall layer 100 is a silicon nitride layer. Lastly, sidewall layer 110 is a final oxide layer. Usually the source/drain regions 20 are formed using sidewall layers 90, 100, and 110 as a mask.

The performance of a transistor, such as the example MOS transistor, is adversely affected by the diffusion of source/drain dopant impurities during the fabrication of the transistor. In the case of PMOS transistors, the boron dopants in the source/drain regions 20 and the source/drain extension regions 30 segregate into the spacer oxide layer 90 during the fabrication process. This migration of dopants from regions 20 and 30 into the spacer oxide layer 90 lowers the doping level in regions 20 and 30; thereby raising the parasitic sheet resistance of the transistor. As a result, the drive current will be reduced and the performance of the transistor will be worsened.

Figure 2A:
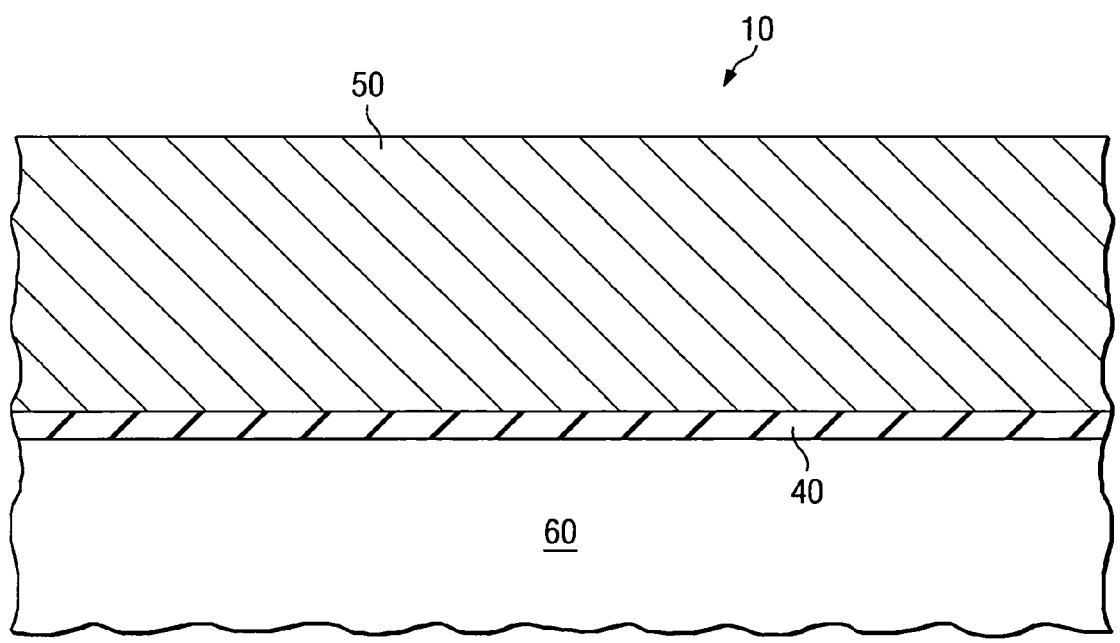
FIGS. 2A-2F are cross-sectional diagrams of a process for forming a MOS transistor in accordance with the present invention.

Referring again to the drawings, FIGS. 2A-2F illustrate a process for forming a MOS transistor in accordance with the present invention. FIG. 2A is a cross-sectional view of a semiconductor structure 10 after the formation of multiple layers on the top surface of a semiconductor substrate. In the example application, the semiconductor substrate 60 is silicon; however any suitable material such as germanium or gallium arsenide may be used.

As shown in FIG. 2A, a gate insulator layer 40 is formed over the surface of the semiconductor substrate 60. As an example, the gate insulator layer 40 is silicon dioxide formed with a thermal oxidation process. However, the gate insulator layer 40 may be any suitable material such as silicon nitride or a high-k gate dielectric material and may be formed using any of a variety of processes.

A gate conductor layer 50 is then formed on the surface of the gate oxide layer 40. The gate conductor layer 50 is comprised of polycrystalline silicon in the example application. However, it is within the scope of the invention to use other materials such as an amorphous silicon, a silicon alloy, or other suitable metals. The gate electrode 50 may be formed using any process technique such as chemical vapor deposition ("CVD") or physical vapor deposition ("PVD"). Together, the gate oxide 40 and the gate electrode 50 comprise the gate stack.

Figure 2B:
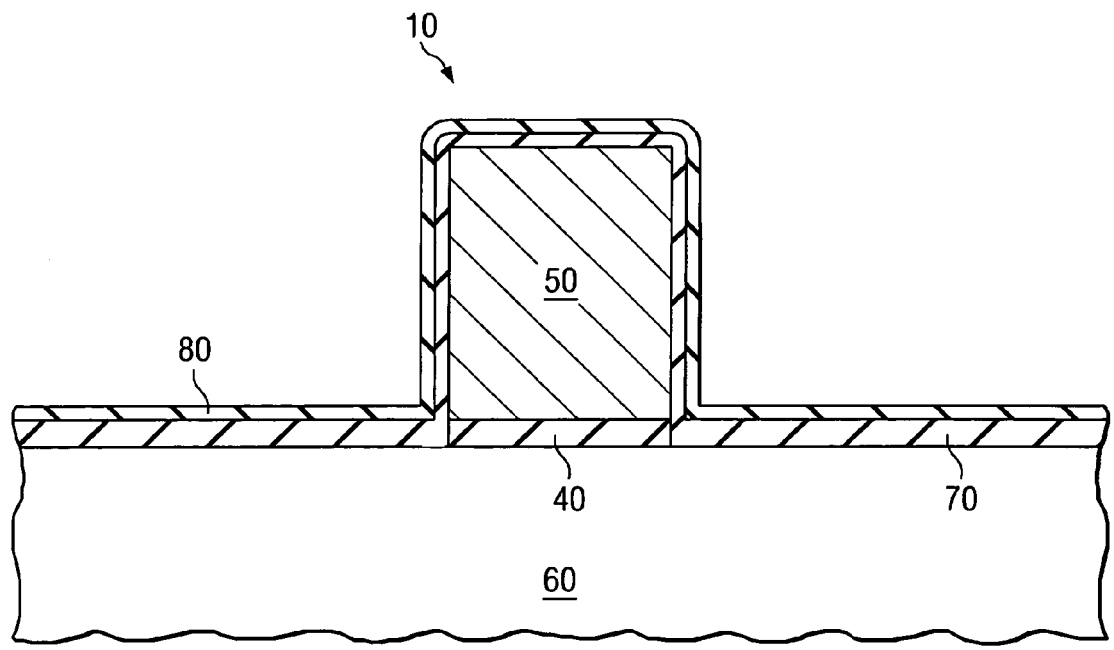

The shape of the gate stack, shown in FIG. 2B, may be created through a variety of processes. For example, the gate stack may be created by forming a layer of photoresist over the semiconductor wafer, patterning the photoresist, and then using the photoresist pattern to etch both the gate oxide layer 40 and the gate electrode layer 50. The gate stack may be etched using an anisotropic etch process or any other suitable etch process.

The intermediate oxide layer 70 is now formed by any suitable process, such as a thermal oxidation or deposited oxide process. In the example application, the intermediate oxide layer is comprised of silicon oxide; however, other materials such as silicon oxy-nitride or binary metal oxide may be used. Next, a CVD process is used to create the conformal layer 80 of offset silicon nitride. However, it is within the scope of the invention to use other processes, such as plasma enhanced chemical vapor deposition ("PECVD") or atomic layer deposition ("ALD"), to create the offset nitride layer 80. It is also within the scope of the invention to use other materials such as oxy-nitride or silicon dioxide.

Figure 2C:
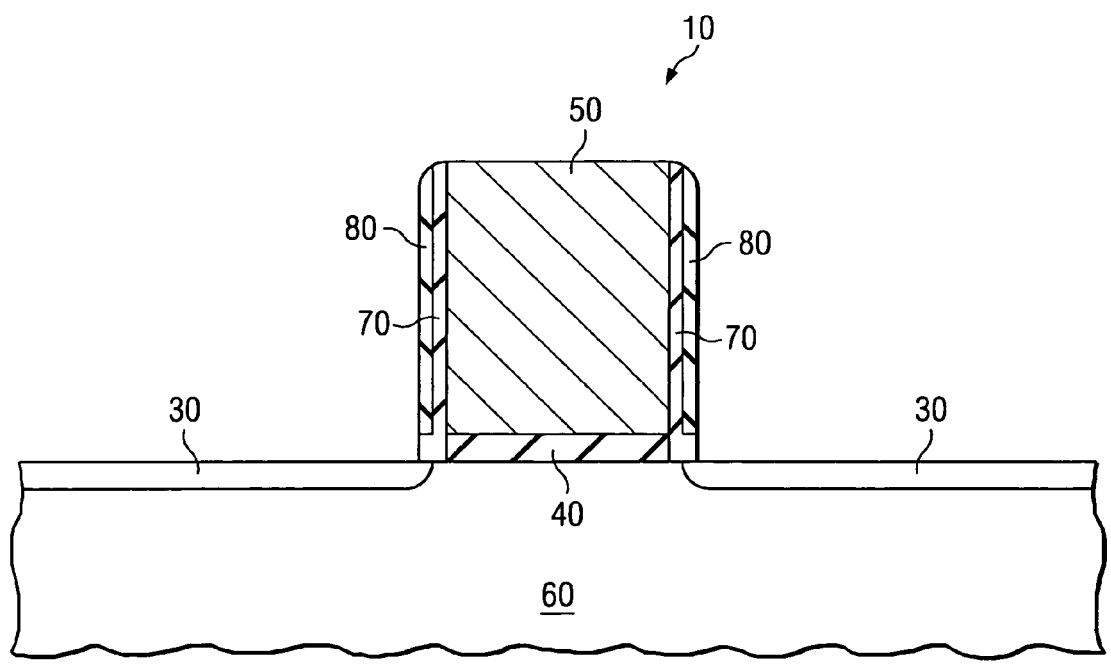

After the formation of sidewall layers 70 and 80, an etch process (such as an anisotropic plasma etch) is used to remove the intermediate oxide layer 70 and the offset nitride layer 80 from all areas of the upper surface of the semiconductor wafer except the sides of the gate stack, as shown in FIG. 2C. In the example application, the source/drain extension regions 30 are now created. However, it is within the scope of the invention to form the source and drain extension regions 30 at any point in the manufacturing process.

The source/drain extension regions 30 are formed near the top surface of the semiconductor substrate 60, as shown in FIG. 2C. There are various methods for forming the source and drain extension regions. For example, the extension regions 30 may be formed by low-energy ion implantation, or gas phase or solid phase diffusion. The dopants used to create the extension regions 30 are p-type (typically boron) for PMOS FET transistors, and n-type (typically phosphorous or arsenic) for NMOS FET transistors. However, other dopants, or combinations of dopants, may be used. For example, a low dose of opposite type dopant is widely used as a halo implant.

In this example application, the sidewalls 70 and 80 are used to direct the dopant implantation to the proper location 30 within the semiconductor substrate 60. Thus the source and drain extension regions 30 initiate from points in the semiconductor substrate 60 that are inside the outer edges of the intermediate oxide layer 70 (due to the lateral straggling of the implanted species), as shown in FIG. 2C.

Figure 2D:
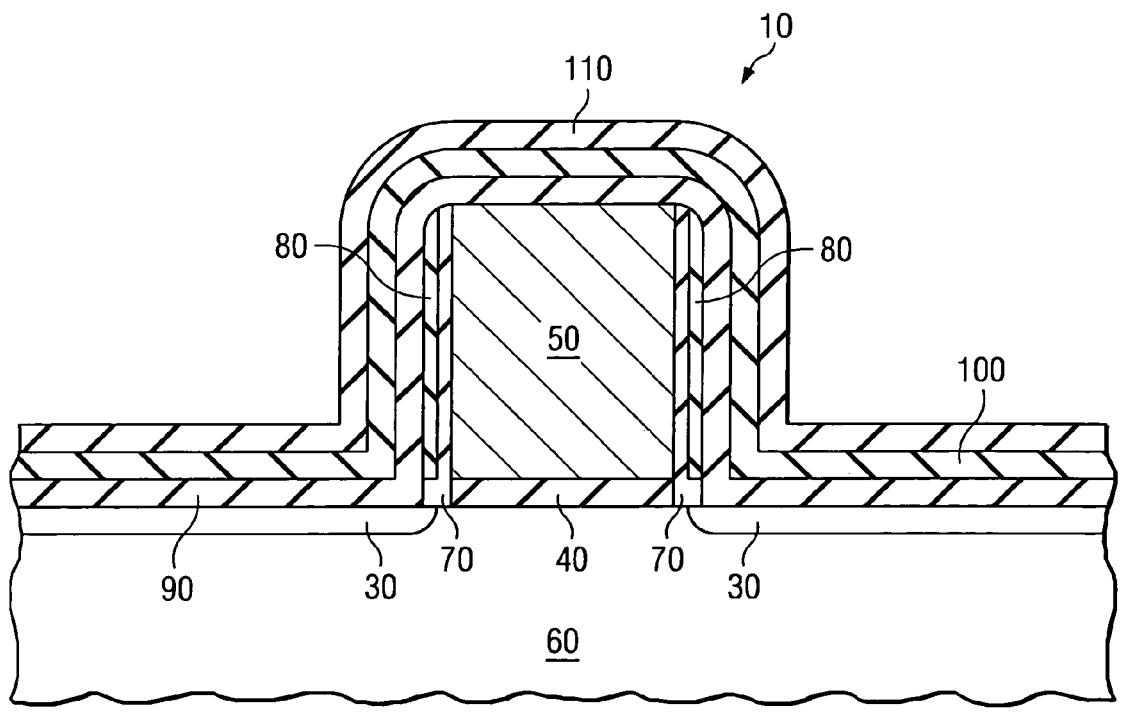

In the best mode application, shown in FIG. 2D, a low hydrogen spacer oxide layer 90 is now formed over the semiconductor wafer. The spacer oxide layer 90 is comprised of silicon oxide and is typically deposited by a CVD technique. However, it is within the scope of the invention to use other materials for the spacer oxide layer 90 such as oxy-nitride or nitride. Furthermore, it is within the scope of the invention to use other process techniques such as PECVD or ALD. In this example the thickness of the spacer oxide layer 90 is approximately 50-300 Å.

The spacer oxide layer 90 may be formed using any of a variety of apparatuses. For example, the spacer oxide layer 90 may be formed in a batch furnace or a single wafer reactor.

If a batch furnace is used, the deposition process usually takes place within a vacuum chamber and may include chemical vapor deposition. Any suitable machine such as the CVD furnace manufactured by Tokyo Electron Limited ("TEL") may be used. In this example the process is carried out at a temperature between 500-700° C. and a pressure below 1 Torr.

In the best mode application, hydrogen free precursors are used during the deposition of the spacer oxide layer 90. In a first example process, the reaction formula is $Si_2Cl_6+N_2O \rightarrow SiO_2+Cl_2+N_2$. In a second example process, the formula is $Si_2Cl_6+NO \rightarrow SiON+Cl_2+N_2$. However, the use of silicon source precursors other than hexachlorodisilane ("HCD") liquids and the use of oxidants other than $N_2O$ or NO are within the scope of this invention. In the best mode application the carrier gas is $N_2$, however other carrier gasses such as He or Ar may be used. Since the reaction precursors do not contain hydrogen, only minimal hydrogen (generally <1%) is incorporated in the resulting film (caused by residual hydrogen gas in the reactor).

If a single wafer process is used then the temperature and duration of the heating cycle is reduced. This shortened heating cycle (minutes for a single wafer processes versus hours for a batch processes) reduces the thermal budget and may improve the semiconductor device performance.

Any suitable machine such as the Xgen manufactured by Applied Materials ("AMT") may be used to form the spacer oxide layer 90 in a CVD process. In this example, the temperature may range from 500-700° C. and the pressure may range from 50-300 Torr. As with the batch process, a pure $N_2$ carrier gas is used; however inert gasses such as Ar or He could be used. Again in the best mode application, a hydrogen free precursor is used during the deposition of the spacer oxide layer 90. In a first example process the formula is $Si_2Cl_6+N_2O \rightarrow SiO_2+Cl_2+N_2$. In a second example process the reaction formula is $Si_2Cl_6+NO \rightarrow SiON+Cl_2+N_2$. However, the use of silicon source precursors other than hexachlorodisilane ("HCD") liquids and oxidants other than $N_2O$ or NO are within the scope of this invention.

If a plasma enhanced chemical vapor deposition ("PECVD") process is used then any suitable machine (such as the machines manufactured by Novellus) may be used to form the spacer oxide layer 90. In this example, the temperature is lower—ranging from 300-500° C.—and the pressure is generally less than 10 Torr. As with the batch process, a pure $N_2$ carrier gas is used; however inert gasses such as Ar or He may be used. Again, in the best mode application a hydrogen free precursor is used during the deposition of the spacer oxide layer 90. In a first example process the reaction formula is $Si_2Cl_6+N_2O \rightarrow SiO_2+Cl_2+N_2$. In a second example process the formula is $Si_2Cl_6+NO \rightarrow SiON+Cl_2+N_2$. However, the use of silicon source precursors other than hexachlorodisilane ("HCD") liquids and oxidants other than $N_2O$ or NO are within the scope of this invention.

The hydrogen content of a spacer oxide layer 90 created by the above-described processes is generally less than 1%. This is far less hydrogen than the hydrogen content of a silicon oxide deposited using tetraethylorthosilicate ("TEOS") or silane ($SiH_4$) as the silicon source gas (which typically results in a hydrogen concentration of 3-7%, depending on the process conditions). The reduced hydrogen concentration of the present invention has a significant impact on the source/drain extension junction profiles after the annealing process (this mechanism will be discussed later).

If the $Si_2Cl_6+NO \rightarrow SiON+Cl_2+N_2$ process is used, then nitrogen is incorporated in the silicon oxide film. The incorporation of nitrogen into the spacer oxide layer 90 reduces boron dopant loss and thereby reduces parasitic resistance.

Referring again to FIG. 2D, a silicon nitride layer 100 is now formed over the semiconductor wafer. The silicon nitride layer 100 may be formed using any one of a variety of techniques. For example, layer 100 may be formed using a CVD, PECVD, or ALD process. Preferably, a nitride material with a low hydrogen concentration or with stable hydrogen bonding (to annealing) is used.

Next, a final oxide layer 110 is formed over the semiconductor wafer. In the example application the final oxide layer 110 is comprised of tetraethylorthosilicate ("TEOS"); however other materials such as a hydrogen free silicon source precursor, silane, or disilane may be used. In addition, any one of a number of processes may be used to create the final oxide layer 100. For example, a CVD, PECVD, or ALD process could be used with a single wafer reactor or a batch furnace.

Figure 2E:
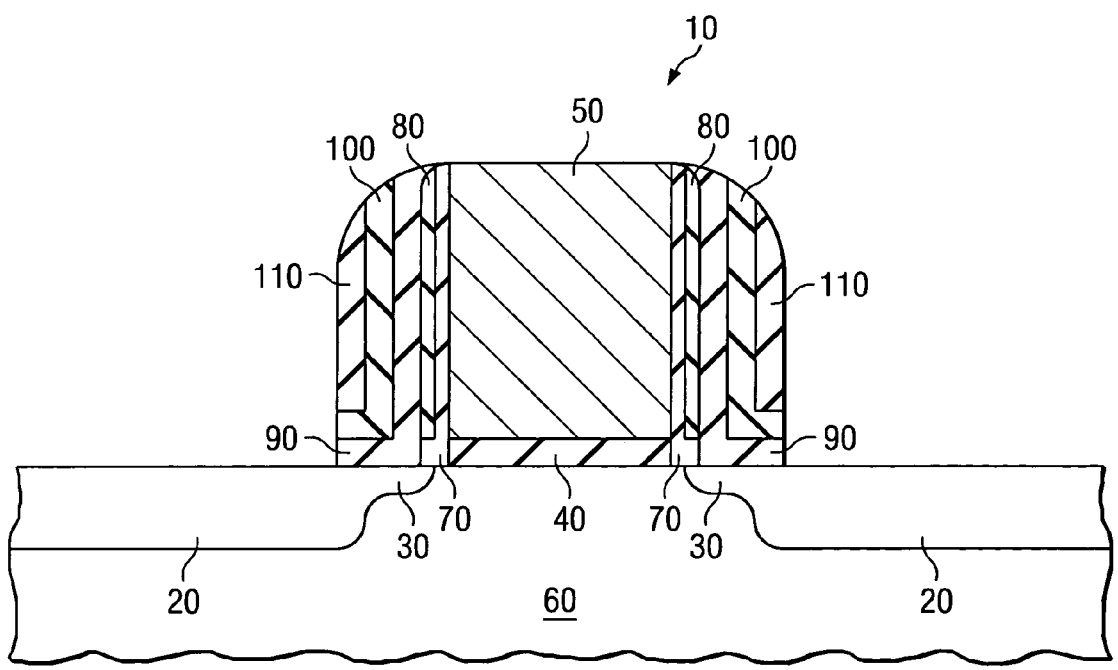

As shown in FIG. 2E, an anisotropic etch or plasma etch process is now used to form the sidewall layers into a shape that will be used as a template for the source/drain implantation step. In the example application the source/drain regions 20 are now created. However, it is within the scope of the invention to form the source and drain regions 20 at another point in the manufacturing process.

The source/drain regions 20 are formed with any one of a variety of methods, such as ion implantation, or gas phase or solid phase dopant diffusion. The dopants used to create the source and drain regions 20 are typically boron (for PMOS FET transistors), phosphorous, or arsenic (both for NMOS FET transistors). However, other dopants or combinations of dopants may be used.

The implantation of the dopants is self-aligned with respect to the outer edges of the sidewalls (i.e. layers 90, 100, and 110). However, the source and drain regions 20 initiate from points in the semiconductor substrate 60 that are slightly inside the outer edges of the sidewall layers 90, 100, and 110, as shown in FIG. 2E, due to the lateral straggling of the implanted species.

In the example application, the source/drain regions 20 and the source/drain extension regions 30 are activated by an anneal step. This anneal step also acts to repair the damage to the semiconductor wafer and to activate the dopants. The activation anneal may be performed by any technique such as rapid thermal annealing ("RTA"), flash lamp annealing ("FLA"), or laser annealing.

Figure 2F:
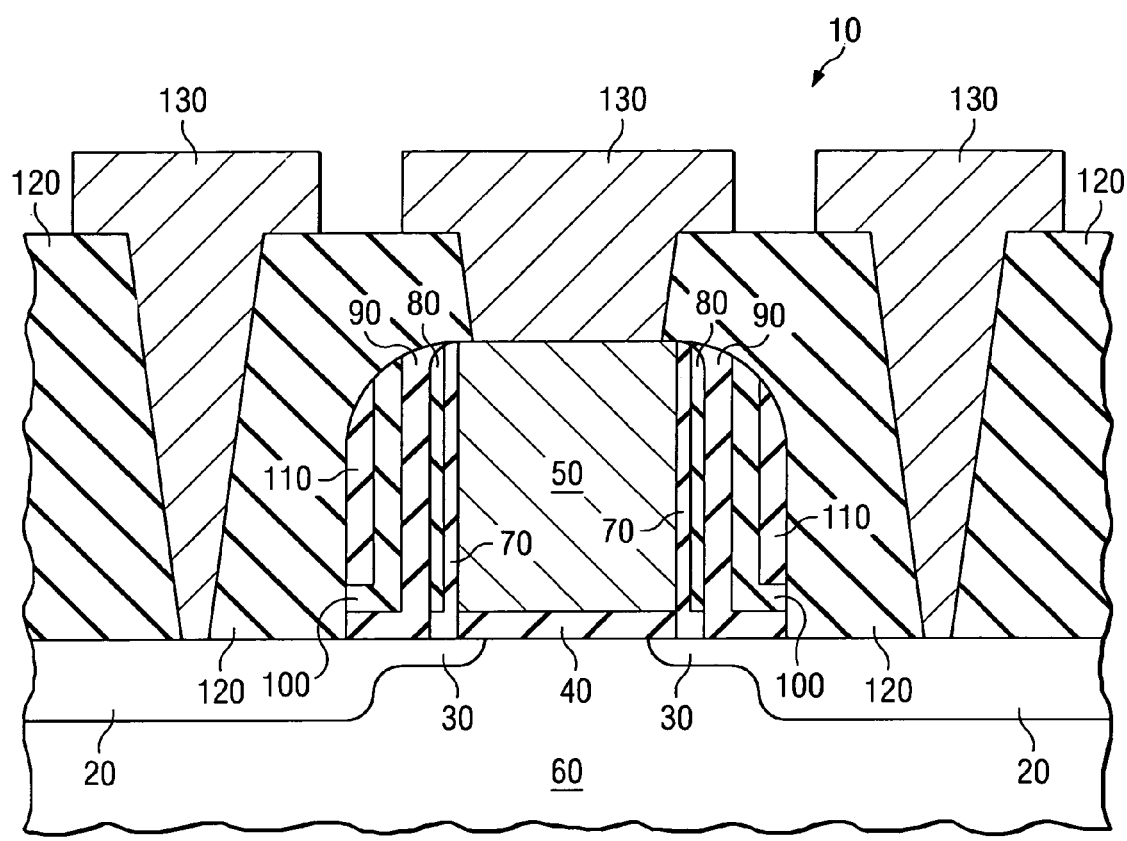

As shown in FIG. 2F, the anneal step often causes a lateral migration of the opposing source/drain regions 20 and source/drain extension regions 30 toward each other. The result is that the distance between the source and drain regions 20 and the source and drain extension regions (commonly called the 'effective gate length') is decreased under the gate stack.

During the annealing step some dopant atoms (i.e. boron) may segregate into the silicon oxide film 90. The segregation is greatly enhanced by the presence of hydrogen. This enhanced segregation leads to a reduction of active dopant in the source/drain extension 30 and the source/drain region 20, resulting in a high series resistance and a generally less abrupt junction profile. The high resistance and less abrupt junction profile are detrimental to transistor performance. Therefore, the low hydrogen content within the silicon oxide 90 is beneficial to the formation of a better junction profile.

Figure 3:
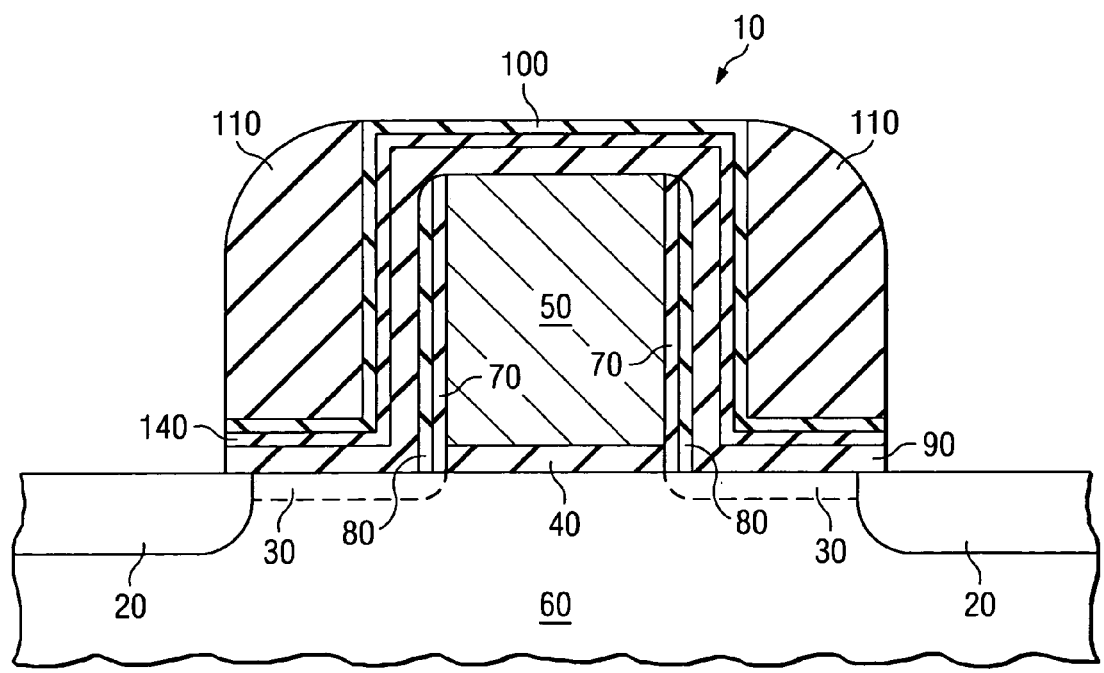
FIG. 3 is a cross-sectional view of a MOS transistor in accordance with a second embodiment of the present invention.

One of the variations to the present invention is to deposit a hydrogen barrier layer 140 such as aluminum oxide ($Al_2O_3$) between layer 90 and layer 100 to prevent an increase of hydrogen content due to the diffusion of hydrogen into layer 90 from layers 100 and 110 during the anneal step. This alternative embodiment of the present invention is shown in FIG. 3.

In yet another variation to the present invention, a hydrogen free silicon source such as HCD is not needed to form layer 90. For example, TEOS and silane can be used to form layer 90. In this case, an annealing is performed to reduce the hydrogen concentration in layer 90. Then an $Al_2O_3$ film is deposited before forming layer 100 (FIG. 3).

The fabrication of the semiconductor wafer now continues until the semiconductor device is complete. As shown in FIG. 2F, the final structure of the example transistor generally includes an insulator layer 120 and contacts 130. The insulator layer may be formed using PECVD or another suitable process. Furthermore, the insulator layer 120 may be comprised of any suitable material such as Fluorinated silicate glass ("FSG") or organosilicate glass ("OSG").

The contacts 130 are formed by etching the insulator layer 120 to expose the desired gate, source, and/or drain. An example etch process is an anisotropic etch. The etched spaces are filled with conductive material, such as copper, aluminum, or other suitable metals or alloys, to create the electrical interconnections between semiconductor components.

Various modifications to the invention as described above are within the scope of the claimed invention. As an example, interfacial layers may be formed between any of the layers shown. Similarly, any of the sidewall layers described in the example application may be omitted. For example, the intermediate nitride layer 80 may be omitted without departing from the scope of the invention. Similarly, if layer 110 is omitted than the thickness of layer 100 may be increased. Moreover, any of the layers described above may be doped further. For example, after forming the gate electrode 50 via a CVD process, a subsequent implantation process may be used to increase the gate conductance.

Furthermore, it is within the scope of this invention to perform additional annealing steps as desired. For instance, an annealing step may be performed after the implantation of the source/drain extension regions 30 but before the formation of the spacer layer 90.

This invention may be implemented in a sidewall spacer structure that is comprised of different materials or layers than is described above. In addition, it is within the scope of the invention to use hydrogen free precursors during the formation of any sidewall layer 70, 80, 90, 100, or 110. Moreover, a different process such as PECVD or ALD may be used instead of CVD to create the low hydrogen spacer oxide layer 90. If a different process is used to form the spacer oxide layer 90, then a hydrogen free precursor will be used during that process in accordance with the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a transistor comprising:
   forming a transistor gate stack coupled to a semiconductor substrate;
   forming an intermediate oxide layer coupled to an outer surface of said transistor gate stack;
   forming a offset nitride layer coupled to sides of said intermediate oxide layer;
   forming a spacer oxide layer coupled to an outer surface of said offset nitride layer, said spacer oxide layer comprised of SiON and formed by a hydrogen free precursor CVD process;
   forming a silicon nitride layer coupled to an outer surface of said spacer oxide layer;
   forming a final oxide layer coupled to sides of said silicon nitride layer; and
   forming source/drain regions within said semiconductor substrate after said step of forming said final oxide layer.

2. The method of claim 1 wherein said spacer oxide layer has a hydrogen concentration less than 1%.

3. The method of claim 1 further comprising
   forming source and drain extension regions within said semiconductor substrate following said step of forming said offset nitride layer.

4. The method of claim 1 wherein a high purity $N_2$ carrier gas is used in said CVD process.

5. The method of claim 1 wherein said hydrogen free precursor CVD process is $Si_2Cl_6+NO \rightarrow SiON+Cl_2+N_2$.

6. The method of claim 5 wherein said SiON film has 1-10% N.

7. The method of claim 1 further comprising:
forming a hydrogen barrier layer coupled to an outer surface of said spacer oxide layer following said step of forming said spacer oxide layer, said hydrogen barrier layer also coupled to said silicon nitride layer.

8. The method of claim 7 wherein said hydrogen barrier layer comprises $Al_2O_3$.

9. The method of claim 1 wherein said CVD process is a PECVD process.

10. The method of claim 9 wherein said PECVD process uses a temperature less than or equal to 500° C.

11. The method of claim 1 wherein said CVD process is a batch process.

* * * * *